United States Patent
Wu et al.

(10) Patent No.: US 11,296,259 B2
(45) Date of Patent: Apr. 5, 2022

(54) MICRO SEMICONDUCTOR CHIP, MICRO SEMICONDUCTOR STRUCTURE, AND TRANSFER DEVICE

(71) Applicant: PlayNitride Display Co., Ltd., Zhunan Township (TW)

(72) Inventors: Chih-Ling Wu, Zhunan Township (TW); Yi-Min Su, Zhunan Township (TW); Shiang-Ning Yang, Zhunan Township (TW)

(73) Assignee: PLAYNITRIDE DISPLAY CO., LTD., Zhunan Township (TW)

( * ) Notice: Subject to any disclaimer, the term of this patent is extended or adjusted under 35 U.S.C. 154(b) by 119 days.

(21) Appl. No.: 16/718,982

(22) Filed: Dec. 18, 2019

(65) Prior Publication Data

US 2021/0083149 A1    Mar. 18, 2021

(30) Foreign Application Priority Data

Sep. 16, 2019 (TW) .................. 108133180

(51) Int. Cl.
*H01L 21/67* (2006.01)
*H01L 25/075* (2006.01)
(Continued)

(52) U.S. Cl.
CPC ........ *H01L 33/44* (2013.01); *H01L 21/67144* (2013.01); *H01L 25/0753* (2013.01);
(Continued)

(58) Field of Classification Search
CPC .......... H01L 33/20; H01L 33/58; H01L 33/54
See application file for complete search history.

(56) References Cited

U.S. PATENT DOCUMENTS

| 2008/0220342 A1* | 9/2008 | Klein | H01L 27/14687 430/5 |
| 2015/0247608 A1* | 9/2015 | Monch | F21K 9/61 362/235 |
| 2020/0035882 A1* | 1/2020 | Brodoceanu | H01L 33/58 |

FOREIGN PATENT DOCUMENTS

| CN | 109671661 A | 4/2019 |
| CN | 109935668 A | 6/2019 |

(Continued)

OTHER PUBLICATIONS

Taiwanese Office Action and Search Report dated Mar. 5, 2020, for corresponding Taiwanese Application No. 108133180.

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

A micro semiconductor chip, a micro semiconductor structure, and a transfer device are provided. The micro semiconductor chip includes an epitaxial structure, a first-type electrode, a second-type electrode and a top light guide element. The epitaxial structure has a top surface, a bottom surface and a side surface. The top light guide element is disposed on the top surface of the epitaxial structure, wherein the top light guide element has a light extraction surface and a bottom surface, wherein the edge of the light extraction surface completely overlaps the edge of the bottom surface of the top light guide element. The light extraction surface is a curved surface, a combination of at least two curved surfaces, or a combination of at least one curved surface and at least one planar surface.

13 Claims, 10 Drawing Sheets

(51) Int. Cl.
*H01L 33/24* (2010.01)
*H01L 33/36* (2010.01)
*H01L 33/62* (2010.01)
*H01L 33/20* (2010.01)
*H01L 33/58* (2010.01)
*H01L 33/54* (2010.01)
*H01L 33/44* (2010.01)

(52) U.S. Cl.
CPC .............. *H01L 33/24* (2013.01); *H01L 33/36* (2013.01); *H01L 33/62* (2013.01); *H01L 2933/0016* (2013.01); *H01L 2933/0025* (2013.01)

(56) References Cited

FOREIGN PATENT DOCUMENTS

| | | |
|---|---|---|
| TW | I552387 B | 2/2016 |
| TW | 201705544 A | 2/2017 |
| TW | 201826567 A | 7/2018 |
| TW | 201929264 A | 7/2019 |
| WO | WO 2018-139687 A1 | 8/2018 |

\* cited by examiner

MICRO SEMICONDUCTOR CHIP, MICRO SEMICONDUCTOR STRUCTURE, AND TRANSFER DEVICE

CROSS REFERENCE TO RELATED APPLICATIONS

This application claims priority of Taiwan Patent Application No. 108133180, filed on Sep. 16, 2019, the entirety of which is incorporated by reference herein.

BACKGROUND

Field of the Disclosure

The disclosure relates to a micro semiconductor chip, a micro semiconductor structure, and a transfer device which is used to transfer the micro semiconductor chip.

Description of the Related Art

With the advancements being made in the field of optoelectronics technology, the size of optoelectronic components has gradually evolved toward miniaturization. In recent years, due to breakthroughs in the size of light-emitting diodes (LEDs), micro light-emitting diode (micro LED) displays, in which arrays of light-emitting diodes are arranged in an array, have increasingly interested people in the field. A micro LED display is an active micro semiconductor device display, and it is more energy-efficient than organic light-emitting diode (OLED) displays. Furthermore, a micro LED display has better contrast performance than an OLED display, and it is visible in sunlight.

The performance of the micro light-emitting diode display depends on the light extraction efficiency of the micro light-emitting diode chip used in the micro light-emitting diode display. Therefore, a novel micro light-emitting diode chip with improved light extraction efficiency is desired.

BRIEF SUMMARY

According to embodiments of the disclosure, the disclosure provides a micro semiconductor chip. The micro semiconductor chip includes an epitaxial structure, a first-type electrode, a second-type electrode, and a top light guide element. The epitaxial structure has a top surface, a bottom surface, and a side surface, wherein the top surface is opposite the bottom surface, and the side surface connects the top surface to the bottom surface. The first-type electrode and the second-type electrode disposed on the bottom surface of the epitaxial structure. The top light guide element is disposed on the top surface of the epitaxial structure, wherein the top light guide element has a light extraction surface and a bottom surface, wherein the edge of the light extraction surface may completely overlap the edge of the bottom surface of the top light guide element, and the light extraction surface of the micro semiconductor chip is a curved surface, a combination of at least two curved surfaces, or a combination of at least one curved surface and at least one planar surface. The bottom surface of the top light guide element is in contact with the epitaxial structure.

According to embodiments of the disclosure, the top light guide element consists of a thermal curable material, wherein the thermal curable material has a thermal curing temperature from about 50° C. to 250° C.

According to embodiments of the disclosure, the refractive index of the thermal curable material is greater than 1, and the refractive index of the thermal curable material can be less than or equal to the refractive index of the epitaxial structure.

According to embodiments of the disclosure, the light transmittance of the thermal curable material is greater than or equal to 80%.

According to embodiments of the disclosure, the thermal curable material is a photoresist material, such as negative photoresist.

According to embodiments of the disclosure, the thermal curable material thermoplastic polysiloxane resin, thermoplastic epoxy resin, thermolplastic polyimide resin, or a combination thereof.

According to embodiments of the disclosure, an orthogonal projection of the light extraction surface onto the top surface of the epitaxial structure has an area S2, and the top surface of the epitaxial structure has an area S1, wherein S2/S1 is between 0.7 and 1.

According to embodiments of the disclosure, the ratio (H1/H) of the maximum height H1 of the top light guide element in the light extraction direction to the maximum height H of the epitaxial structure in the light extraction direction is between 0.1 and 0.5.

According to embodiments of the disclosure, a chamfer is formed at the connection of the top surface of the epitaxial structure and the side surface of the epitaxial structure.

According to embodiments of the disclosure, the micro semiconductor chip further includes an insulating layer disposed on the side surface of the epitaxial structure.

According to embodiments of the disclosure, the micro semiconductor chip further includes a side light guide element disposed on the side surface.

According to embodiments of the disclosure, the refractive index of the side light guide element is greater than 1, and the refractive index of the side light guide element is less than or equal to the refractive index of the epitaxial structure.

According to embodiments of the disclosure, the top light guide element and the side light guide element are made of the same material.

According to embodiments of the disclosure, the disclosure provides a micro semiconductor structure. The micro semiconductor structure includes a substrate, at least one of the micro semiconductor chips disposed on the substrate, and at least one supporting element. One end of the supporting element is disposed on the substrate, and the other of the supporting element is connected to the side surface of the micro semiconductor chip so that the micro semiconductor chip is fixed to the substrate via the supporting element.

According to embodiments of the disclosure, the top light guide element and the supporting element are made of the same material.

According to embodiments of the disclosure, the top light guide element, the side light guide element is integrated with the supporting element.

According to embodiments of the disclosure, the disclosure provides a transfer device. The transfer device is used to transfer the aforementioned micro semiconductor chip, or to dispose the aforementioned micro semiconductor chip of the micro semiconductor structure. The transfer device includes at least one pickup element which is used to pick up the micro semiconductor chip, wherein the pickup element has a transferring surface, and the contour of the transferring surface matches the contour of at least a part of the light extraction surface of the micro semiconductor chip.

According to embodiments of the disclosure, the transferring surface of the pickup element is a curved surface, a combination of at least two curved surfaces, or a combination of at least one curved surface and at least one planar surface.

According to embodiments of the disclosure, the light extraction surface of the micro semiconductor chip has an area A1. The contour of the light extraction surface, which matches the contour of the transferring surface, of the top light guide element of the micro semiconductor chip has an area A2. In particular, A2/A1 is between 0.5 and 1.

BRIEF DESCRIPTION OF THE DRAWINGS

A detailed description is given in the following embodiments with reference to the accompanying drawings. It should be emphasized that many features are not drawn to scale according to industry standard practice. In fact, the dimensions of the various components may be arbitrarily increased or decreased for clarity of discussion.

DETAILED DESCRIPTION

Figure 1:
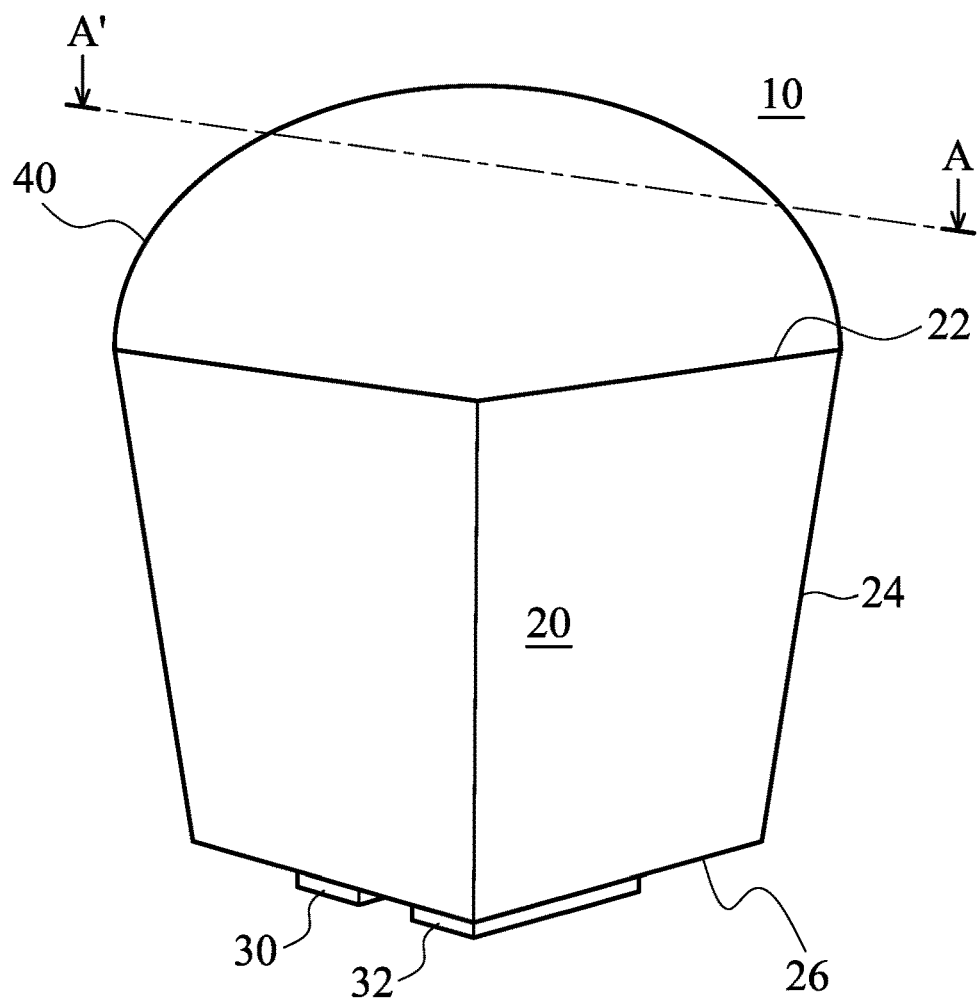
FIG. 1 is a schematic diagram of the micro semiconductor chip according to an embodiment of the disclosure.

The micro semiconductor chip and the micro semiconductor structure of the disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first layer disposed on a second layer", may indicate not only the direct contact of the first layer and the second layer, but also a non-contact state with one or more intermediate layers between the first layer and the second layer. In the above situation, the first layer may not directly contact the second layer.

It should be noted that the elements or devices in the drawings of the disclosure may be present in any form or configuration known to those skilled in the art. In addition, the expression "a layer overlying another layer", "a layer is disposed above another layer", "a layer is disposed on another layer" and "a layer is disposed over another layer" may refer to a layer that is in direct contact with the other layer, and they may also refer to a layer that does not directly contact the other layer, there being one or more intermediate layers disposed between the layer and the other layer.

The drawings provided are only schematic diagrams and are non-limiting. In the drawings, the size, shape, or thickness of some of the elements may be exaggerated and not drawn to scale, for illustrative purposes. The dimensions and the relative dimensions do not correspond to actual location in the practice of the disclosure. The disclosure will be described with respect to particular embodiments and with reference to certain drawings, but the disclosure is not limited thereto.

Furthermore, the use of ordinal terms such as "first", "second", "third", etc., in the disclosure to modify an element does not by itself connote any priority, precedence, or order of one claim element over another or the temporal order in which it is formed, but are used merely as labels to distinguish one claim element having a certain name from another element having the same name (but for use of the ordinal term) to distinguish the claim elements.

The disclosure provides a micro semiconductor chip (such as micro light-emitting diode chip) and a micro semiconductor structure employing the same. By means of the specific light extraction surface of the micro semiconductor chip, the light, which is emitted by the micro semiconductor chip and emits into the top light guide element, can pass through the top light guide element via refraction, thereby reducing the probability of total reflection. Therefore, the light extraction efficiency of the micro semiconductor chip can be improved. As a result, the performance of the display device (such as micro light-emitting diode display device) employing the micro semiconductor chip can also be improved.

In addition, the disclosure provides a transfer device, which is used to transfer the micro semiconductor chip of the disclosure. Since the contour of the transferring surface is designed to match the contour of at least a part of the light extraction surface of the aforementioned micro semiconductor chip, the micro semiconductor chip is able to be picked up from a template (such as a carrier) by the transfer device and before the micro semiconductor chip is transferred to a receiving substrate.

As a result, the probability of failing to pick the micro semiconductor chip up can be reduced, thereby improving the yield for transporting and transferring the micro semiconductor chip. Therefore, the production efficiency of the display device employing the micro semiconductor chips can be improved.

The micro semiconductor chip of the disclosure means a semiconductor chip which has a length, width and height within a range of 1 μm to 100 μm. According to embodiments of the disclosure, the micro semiconductor chip may have a maximum width of 20 µm, 10 µm, or 5 µm. In some embodiments, the micro semiconductor chip may have a maximum height of 10 µm or 5 µm. However, it should be understood that embodiments of the disclosure are not limited thereto, and aspects of certain embodiments may be applied to larger and perhaps smaller scales.

According to embodiments of the disclosure, the micro semiconductor chip of the disclosure can be a micro semiconductor chip employing a p-n diode, such as a micro semiconductor chip which can be controlled to perform predetermined opto-electronic functions. For example, the micro semiconductor chip can be a light-emitting diode chip, a laser diode chip, or a photodiode chip. In addition, compared with general LED technology, the dimension of the micro semiconductor chip is reduced from the millimeter level to the micron level, and therefore the micro semiconductor chip of the present disclosure is transferred and assembled to obtain a micro LED display. The resulted micro LED display can achieve high resolution and reduce the power consumption of display, and therefore, it has such advantages as being energy-saving, having a simple mechanism, being thin, and so on.

Figure 2:
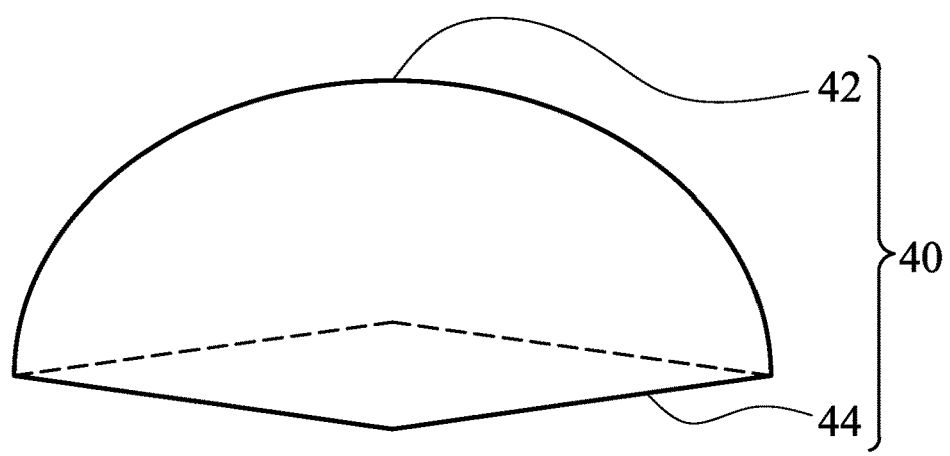
FIG. 2 is a schematic diagram of the top light guide element 40 of the micro semiconductor chip 10 as shown in FIG. 1.
Figure 3:
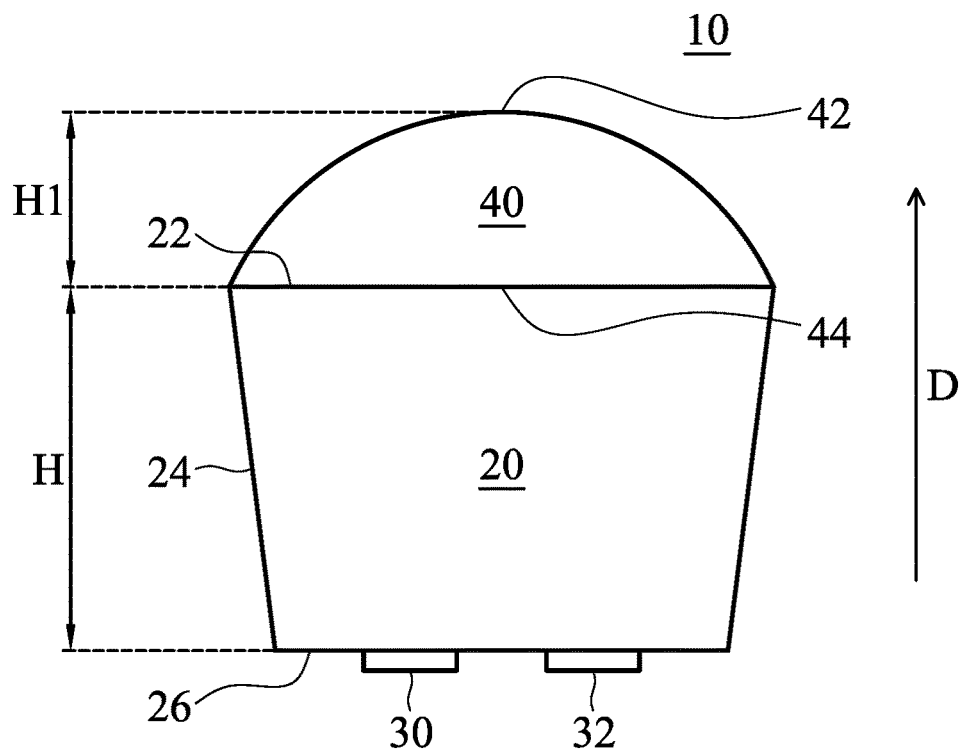
FIG. 3 is a schematic diagram of the micro semiconductor chip 10 along line A-A' of FIG. 1.

FIG. 1 is a schematic diagram of the micro semiconductor chip 10 according to an embodiment of the disclosure. FIG. 2 is a schematic diagram of the top light guide element 40 of the micro semiconductor chip 10 as shown in FIG. 1. FIG. 3 is a schematic diagram of the micro semiconductor chip 10 along line A-A' of FIG. 1.

As shown in FIG. 1, the micro semiconductor chip 10 of the disclosure can include an epitaxial structure 20, a first-type electrode 30, a second-type electrode 32, and a top light guide element 40. The epitaxial structure 20 can have a top surface 22, a bottom surface 26, and a side surface 24, wherein the top surface 22 is opposite the bottom surface 26. The first-type electrode 30 and the second-type electrode 32 disposed on the bottom surface 26 of the epitaxial structure 20. Namely, the micro semiconductor chip 10 of the disclosure can be a horizontal structure micro semiconductor chip 10 or a flip-chip structure micro semiconductor chip 10 (i.e. the first-type electrode 30 and the second-type electrode 32 are disposed on the same side of the epitaxial structure 20 of the micro semiconductor chip 10). According to other embodiments of the disclosure, the epitaxial structure 20 of the micro semiconductor chip 10 of the disclosure can have a tapered sidewall. Namely, a cross-section of the epitaxial structure 20 can be an inverted trapezoid (which has a greater top width and a smaller bottom width), as shown in FIG. 2. According to other embodiments of the disclosure, the structure and the type of the epitaxial structure 20 are not limited. For example, the cross-section of epitaxial structure 20 of the disclosure can be inverted trapezoid, rectangle, trapezoid or another suitable shape.

According to embodiments of the disclosure, the epitaxial structure 20 can include a first-type semiconductor layer, a light-emitting layer, and a second-type semiconductor layer. The first semiconductor layer and the second semiconductor layer have opposite electrical properties. According to embodiments of the disclosure, the first semiconductor layer can be an n-type semiconductor layer and the second semiconductor layer can be a p-type semiconductor layer. According to embodiments of the disclosure, the first semiconductor layer can be a p-type semiconductor layer and the second semiconductor layer can be an n-type semiconductor layer. The light-emitting layer and the second semiconductor layer are disposed sequentially on the first semiconductor layer. Namely, the light-emitting layer can be disposed between the first semiconductor layer and the second semiconductor layer.

According to embodiments of the disclosure, suitable materials of the first-type electrode 30 and the second-type electrode 32 can be magnesium, calcium, aluminum, silver, indium, gold, tungsten, nickel, platinum, copper, or an alloy thereof, or an oxide thereof, or a combination thereof. The method for forming the first-type electrode 30 and the second-type electrode can be thermal evaporation, sputtering, or plasma enhanced chemical vapor deposition.

As shown in FIG. 1, the top light guide element 40 is disposed on the top surface 22 of the epitaxial structure 20. As shown in FIG. 2, the top light guide element has a light extraction surface 42 and a bottom surface 44, wherein the edge of the light extraction surface 42 of the top light guide element 40 completely overlaps the edge of the bottom surface 44 of the top light guide element 40 (i.e. the orthogonal projection of the light extraction surface 42 of the top light guide element 40 onto the top surface 22 of the epitaxial structure 20 completely overlaps the orthogonal projection of the bottom surface 44 of the top light guide element 40 onto the top surface 22 of the epitaxial structure 20).

Figure 4:
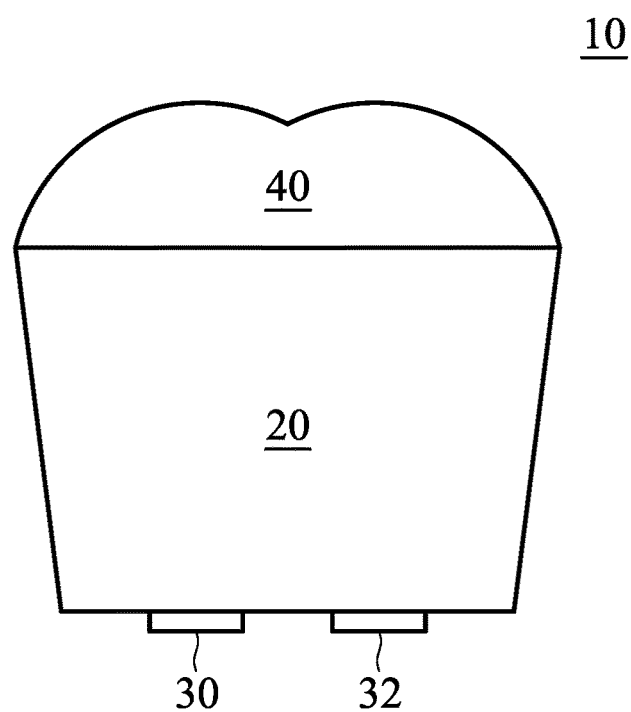
FIGS. 4 to 6 are cross-sectional diagrams of the micro semiconductor chip according to embodiments of the disclosure.
Figure 5:
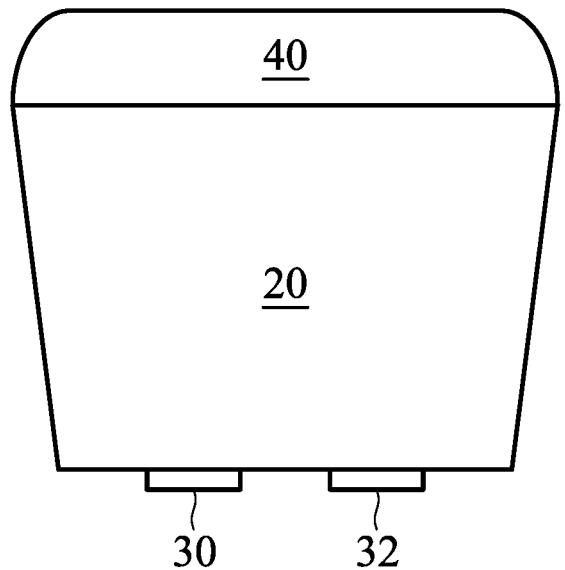
Figure 6:
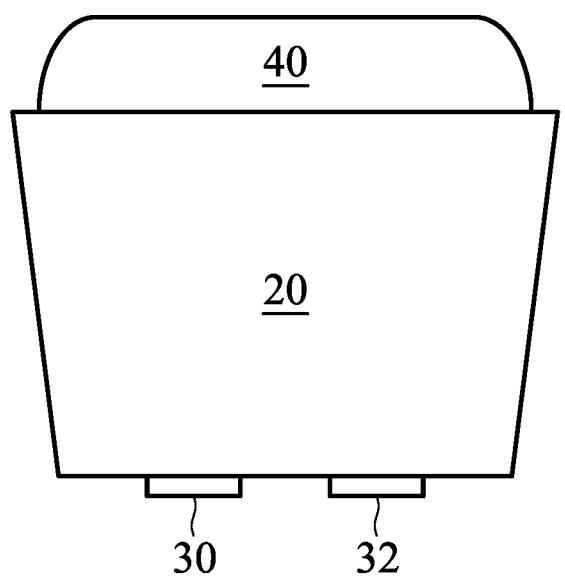

As shown in FIG. 3, the side surface 24 of the epitaxial structure 20 connects the top surface 22 and the bottom surface 26 of the epitaxial structure 20. In addition, the bottom surface 44 of the top light guide element 40 is in direct contact with the top surface 22 of the epitaxial structure 20 (i.e. there is no layer or material between the bottom surface 44 of the top light guide element 40 and the top surface 22 of the epitaxial structure 20), thereby better concentrating the emitted light. Herein, the light extraction surface 42 of the top light guide element 40 can be a curved surface, as shown in FIG. 3. In addition, according to embodiments of the disclosure, the light extraction surface 42 of the top light guide element 40 can be a combination of at least two curved surfaces, as shown in FIG. 4. Furthermore, according to other embodiments of the disclosure, the light extraction surface 42 of the top light guide element 40 can be a combination of at least one curved surface and at least one planar surface, as shown in FIGS. 5 and 6.

As shown in FIG. 3, the micro semiconductor chip 10 has a light extraction direction D, wherein the light extraction direction D is essentially set from the bottom surface 26 of the epitaxial structure 20 to the top surface 22 of the epitaxial structure 20. According to embodiments of the disclosure, the ratio (H1/H) of the maximum height H1 of the top light guide element 40 in the light extraction direction D to the maximum height H of the epitaxial structure 20 in the light extraction direction D is between 0.1 and 0.5 (such as 0.1, 0.2, 0.3, 0.4, or 0.5). If the ratio (H1/H) is too high, the difficulty for fabricating the micro semiconductor chip 10 would be increased. If the ratio (H1/H) is too low, the light extraction efficiency of the micro semiconductor chip 10 would be reduced.

According to embodiments of the disclosure, the top light guide element 40 may consist of a thermal curable material, wherein the thermal curable material has a thermal curing temperature from 50° C. to 250° C. (such as 100° C., 150° C., 200° C. or 250° C.). The thermal curable material is a sticky liquid at room temperature. Since the thermal curable material changes its chemical properties during heating, the thermal curable material is converted into a solid after heating above the thermal curing temperature.

According to embodiments of the disclosure, in order to force the light, which emits into the top light guide element 40, passing through the top light guide element 40 and outside the micro semiconductor chip 10, the refractive index of the thermal curable material can be greater than 1 and less than (or equal to) the refractive index of the epitaxial structure. As a result, the light extraction efficiency of the micro semiconductor chip 10 can be improved and the concentration of light emitted by the micro semiconductor chip 10 can be enhanced. The light transmittance of the thermal curable material greater than or equal to 80% (such as 80%, 90% or 98%). For example, the refractive index of the thermal curable material can be from 1.05 to 2.5 (such as 1.05, 1.5, 2.0 or 2.5).

According to embodiments of the disclosure, the thermal curable material is resin material (such as photoresist material). For example, the thermal curable material can be negative photoresist, such as thermolplastic polysiloxane resin, thermolplastic epoxy resin, thermolplastic polyimide resin, or a combination thereof.

Figure 7A:
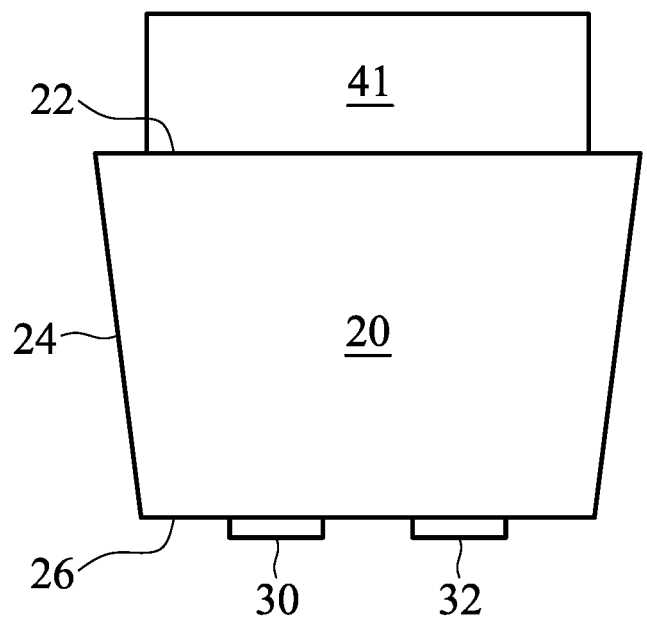
FIGS. 7A and 7B are a series of diagrams showing the method for fabricating the top light guide element of the micro semiconductor chip according to an embodiment of the disclosure.

According to embodiments of the disclosure, the method for fabricating the top light guide element 40 of disclosure can include following steps. First, as shown in FIG. 7A, a layer of thermal curable material 41 is disposed on the top surface 22 of the epitaxial structure 20. For example, when the thermal curable material 41 is a resin material, the resin material can be dissolved in a solvent to form a coating composition (with a solid content of 5 wt % to 90 wt %) in advance. Next, the coating composition is coated on the top surface 22 of the epitaxial structure 20 to form a coating. The formation of the coating can be, for example, accomplished by screen printing, spin coating, bar coating, blade coating, roller coating, dip coating, spray coating, or brush coating. Finally, the coating is subjected to a curing process, obtaining the thermal curable material 40, as shown in FIG. 7B.

Figure 7B:
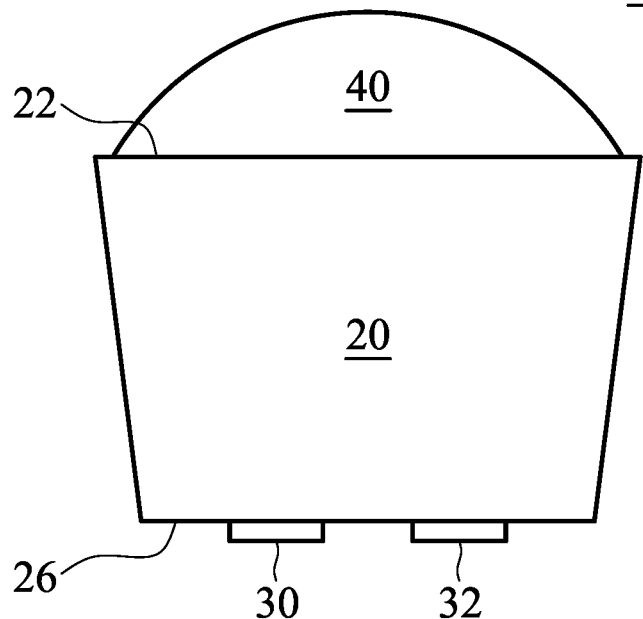
Figure 8:
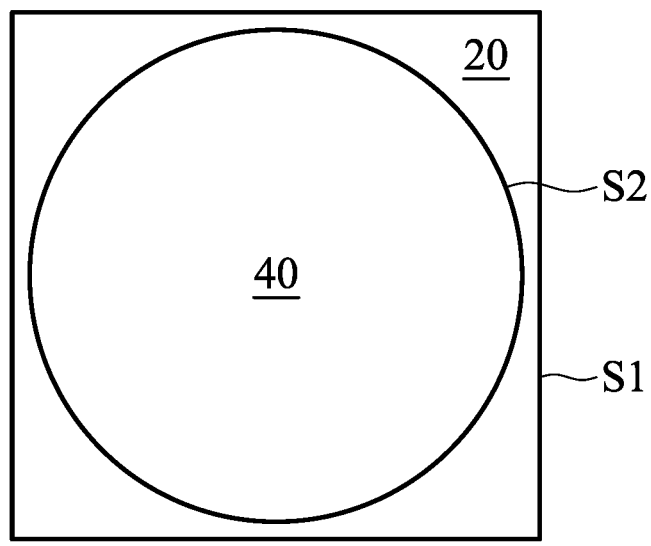
FIG. 8 is a schematic top-view diagram of the micro semiconductor chip 10 as shown in FIG. 7B.

FIG. 8 is a schematic top-view diagram of the micro semiconductor chip 10 as shown in FIG. 7B. According to embodiments of the disclosure, an orthogonal projection of the light extraction surface 42 of the top light guide element 40 onto the top surface of the epitaxial structure 20 has an area S2, and the top surface of the epitaxial structure 20 has an area S1, wherein S2/S1 can be 0.7 and 1 (such as 0.7, 0.8, 0.9 or 1.0). If S2/S1 is too low, the amount of light, which emits into the top light guide element, would be reduced. Therefore, the top light guide element would not improve the light extraction efficiency of the micro semiconductor chip 10.

Figure 9:
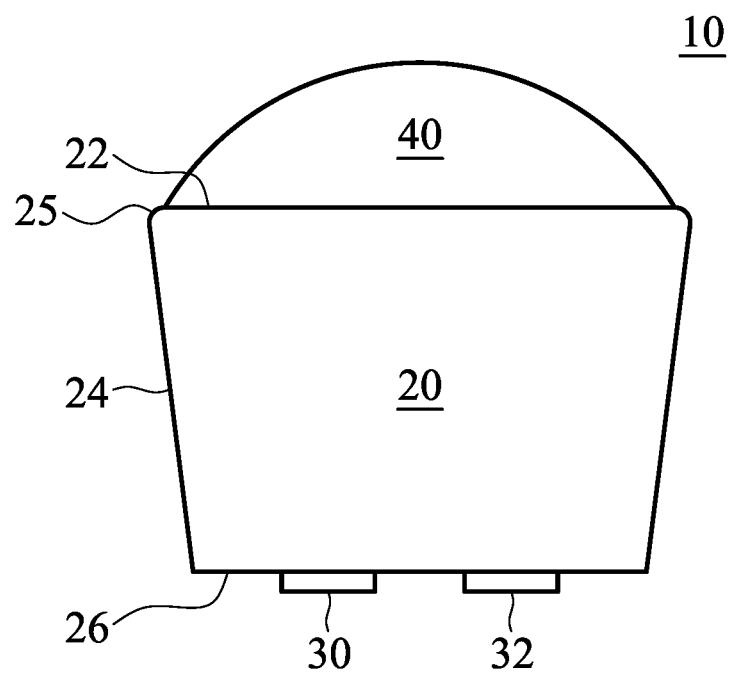
FIGS. 9 to 12 are cross-sectional diagrams of the micro semiconductor chip according to embodiments of the disclosure.

According to embodiments of the disclosure, a chamfer 25 is formed at the connection of the top surface 22 of the epitaxial structure 20 and the side surface 24 of the epitaxial structure 20, as shown in FIG. 9. As a result, the light extraction efficiency at the connection of the top surface and the side surface 24 of the epitaxial structure 20 can be improved.

Figure 10:
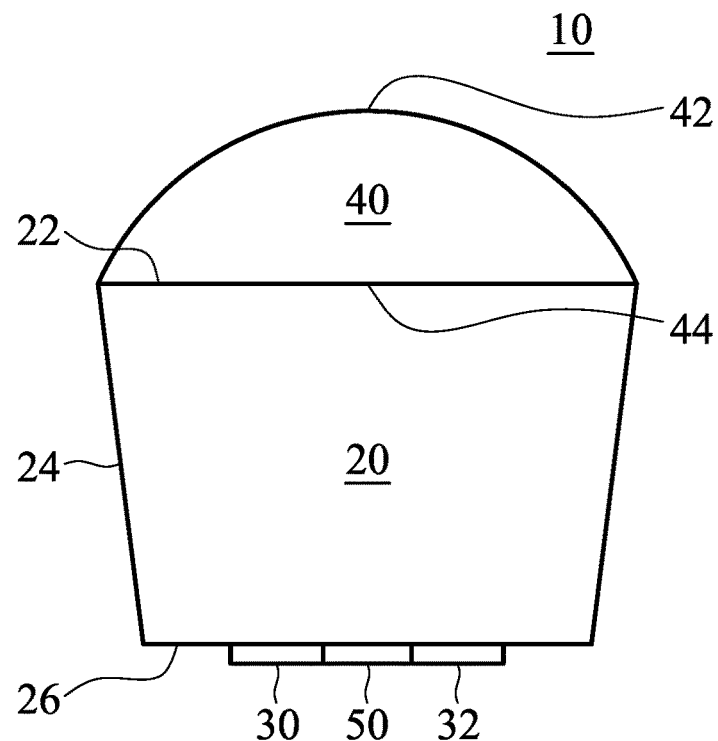
Figure 11:
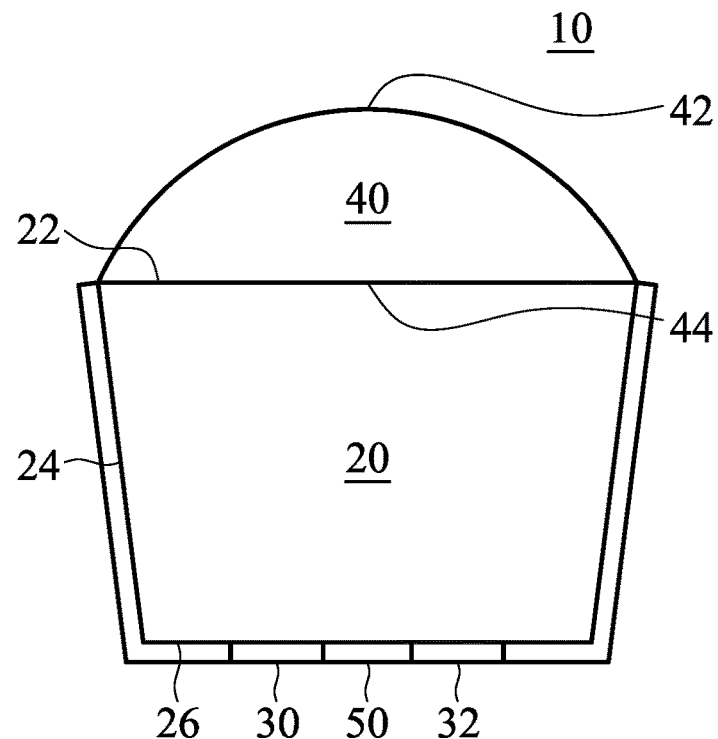

According to embodiments of the disclosure, as shown in FIG. 10, the micro semiconductor chip 10 can further include an insulating layer 50 disposed on at least a part of the bottom surface 26. For example, the insulating layer 50 can be disposed between the first-type electrode 30 and the second-type electrode 32, in order to prevent the first-type electrode 30 and the second-type electrode 32 from coming into contact with each other and causing a short-circuit. In addition, the insulating layer 50 can further extend to cover at least a part of the side surface 24 of the epitaxial structure 20, as shown in FIG. 11, in order to protect the epitaxial structure 20.

Figure 12:
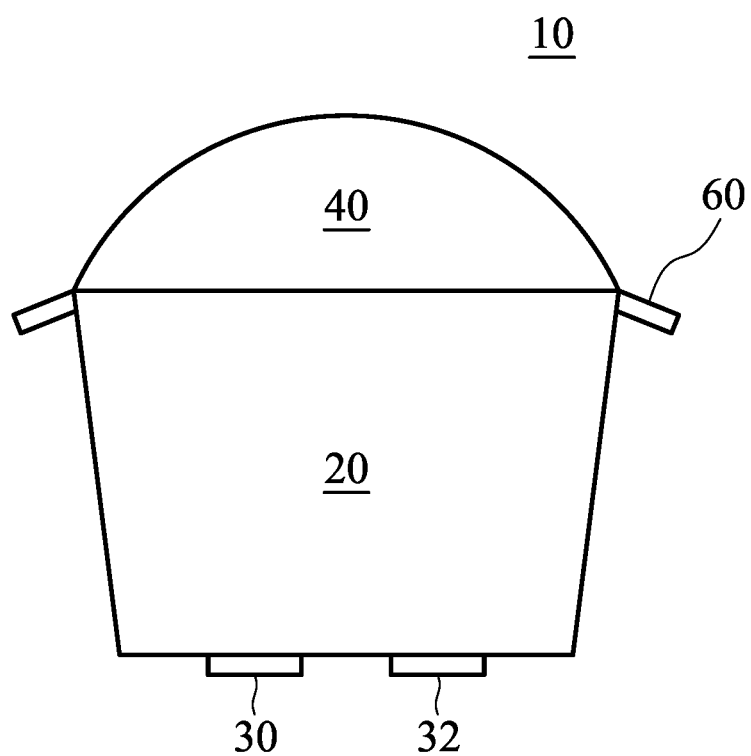

According to embodiments of the disclosure, as shown in FIG. 12, the micro semiconductor chip 10 can further include a side light guide element 60 disposed on the side surface 24 of the epitaxial structure 20, in order to improve the light extraction efficiency of the micro semiconductor chip 10. According to embodiments of the disclosure, the side light guide element 60 can be an inorganic material or resin material.

According to embodiments of the disclosure, the refractive index of the side light guide element 60 can be greater than 1 and less than (or equal to) the refractive index of the epitaxial structure 20. According to other embodiments of the disclosure, the refractive index of the side light guide element 60 can be equal to the refractive index of the top light guide element. According to embodiments of the disclosure, the light transmittance of the side light guide element 60 can be greater than or equal to 80% (such as 80%, 90% or 98%). For example, the side light guide element 60 can be a thermal curable material with a refractive index from 1.05 to 2.5 (such as 1.05, 1.5, 2.0 or 2.5). According to embodiments of the disclosure, the top light guide element 40 of the disclosure and the side light guide element 60 can be made of the same material (i.e. the side light guide element 60 can be made of the thermal curable material). According to embodiments of the disclosure, the top light guide element 40 of the disclosure and the side light guide element 60 can be made of the same material and formed in the same process.

According to embodiments of the disclosure, the side light guide element 60 can be disposed on the two side surfaces 24 (which are opposite each other) of the epitaxial structure 20 of the micro semiconductor chip 10. Furthermore, the side light guide element 60 can be disposed on all the side surfaces 24 of the epitaxial structure 20 of the micro semiconductor chip 10. For example, the side light guide element 60 can be disposed on the side surfaces 24 of the epitaxial structure 20 and surround the epitaxial structure 20.

Figure 13:
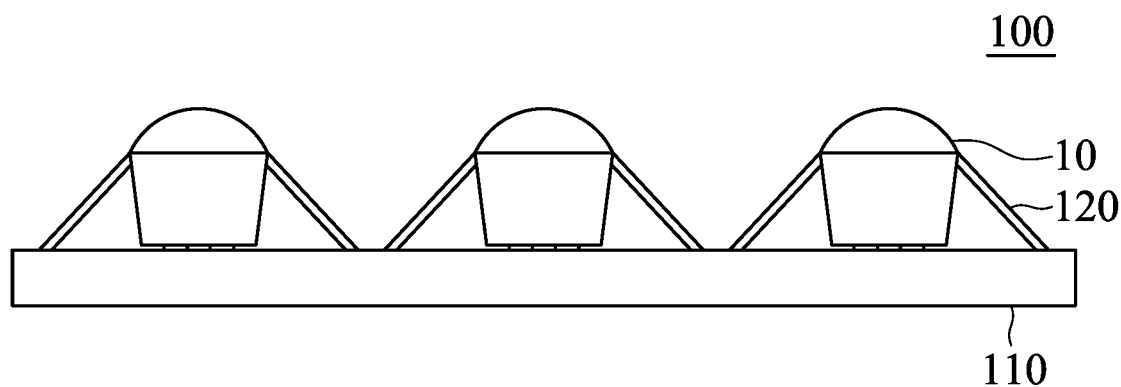
FIGS. 13 and 14 are cross-sectional diagrams of the micro semiconductor structure.

The disclosure also provides a micro semiconductor structure 100, as shown in FIG. 13. According to embodiments of the disclosure, the micro semiconductor structure 100 include a substrate 110, at least one of the aforementioned micro semiconductor chips 10 disposed on the substrate 110, and at least one supporting element 120. One end of the supporting element 120 is disposed on the substrate 110, and the other end of the supporting element 120 is connected to the side surface 24 of the micro semiconductor chip 10 so that the micro semiconductor chip 10 is fixed to the substrate 110 via the supporting element 120.

According to embodiments of the disclosure, the substrate 110 can be a template, for carrying the micro semiconductor chip 10 and the supporting element 120. The substrate 110 can be a plastic substrate, ceramic substrate, glass substrate, sapphire substrate, or another rigid substrate.

According to embodiments of the disclosure, the supporting element 120 can fix the micro semiconductor chip 10 on the substrate 110 for keeping a specific distance between two adjacent micro semiconductor chips 10. As a result, the supporting element can prevent the micro semiconductor chips from being damaged during the subsequent transfer process, thereby enhancing the yield of the subsequent transfer process.

Figure 14:
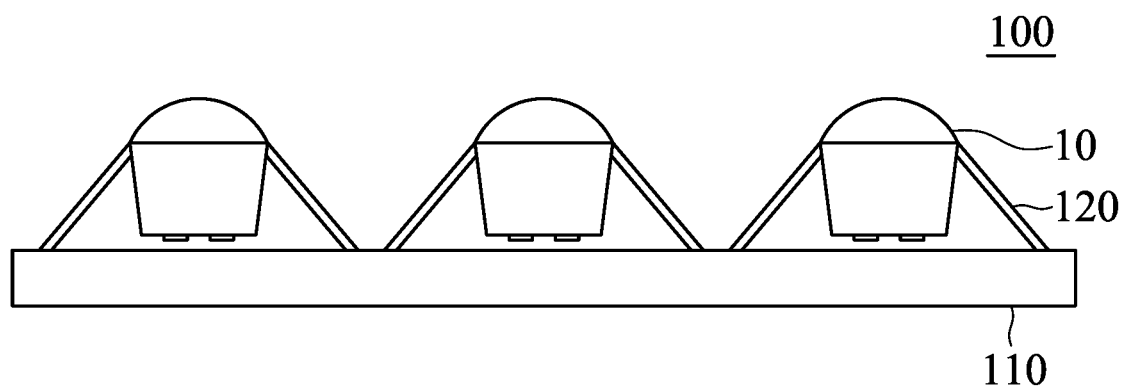

According to embodiments of the disclosure, as shown in FIG. 14, the supporting element 120 can support the micro semiconductor chip 10 to keep the micro semiconductor chip 10 away from the substrate 110, thereby reducing the difficulty of the subsequent transfer process.

According to embodiments of the disclosure, by means a transfer process, the micro semiconductor chip 10 can be transferred to a receiving substrate (such as a display substrate), obtaining a display device (such as micro light-emitting diode display device). During the transfer process, a part of the supporting element 120 can be removed from the micro semiconductor chip 10. Namely, the other part of the supporting element 120 remains on the micro semiconductor chip 10. According to an embodiment of the disclosure, the remained supporting element can be regarded as a part of the side light guide element. According to some embodiments of the disclosure, during the subsequent transfer process, the whole supporting element 120 can be separated from the micro semiconductor chip 10. Namely, the supporting element 120 is not transferred to the receiving substrate along with the micro semiconductor chip 10.

According to embodiments of the disclosure, the transfer process can be a mass transfer process. The mass transfer process can be performed to transfer the micro semiconductor chips 10 from the substrate 110 to the receiving substrate one at a time or in a batch.

According to embodiments of the disclosure, the supporting element 120 can be inorganic material or resin material. According to embodiments of the disclosure, the supporting element 120 of the disclosure and the side light guide element 60 are made of the same material. According to embodiments of the disclosure, the supporting element 120 of the disclosure and the side light guide element 60 can be made of the same material and formed in the same process. According to embodiments of the disclosure, the refractive index of the supporting element 120 can be greater than 1 and less than (or equal to) the refractive index of the epitaxial structure 20, and the refractive index of the supporting element 120 can be from 1.05 to 2.5 (such as 1.05, 1.5, 2.0 or 2.5). According to embodiments of the disclosure, the light transmittance of the supporting element 120 can be greater than or equal to 80% (such as 80%, 90% or 98%).

According to embodiments of the disclosure, the supporting element 120 of the disclosure and the top light guide element 40 are made of the same material. According to embodiments of the disclosure, the supporting element 120 of the disclosure and the top light guide element 40 are made of the same material and formed in the same process (i.e. the supporting element 120 is integrated with the top light guide element 40). According to embodiments of the disclosure, the supporting element 120 of the disclosure, the top light guide element 40 and the side light guide element 60 are made of the same material. According to embodiments of the disclosure, the supporting element 120 of the disclosure, the top light guide element 40 and the side light guide element 60 are made of the same material and formed in the same process (i.e. the supporting element 120, the top light guide element 40 and the side light guide element 60 are integrated therewith).

According to embodiments of the disclosure, since the supporting element 120 and the top light guide element 40 can be made of the same material, the top light guide element 40 can be formed simultaneously in the process for forming the supporting element 120 (i.e. the supporting element 120 can be integrated with the top light guide element 40). As a result, since the supporting element 120 and the top light guide element 40 can be formed by the same process, the process for fabricating the micro semiconductor structure 100 can be simplified, thereby improving the processing efficiency and yield.

Furthermore, since the supporting element 120, the top light guide element 40 and the side light guide element 60 can be made of the same material, the top light guide element 40 and the side light guide element 60 can be formed simultaneously in the process for forming the supporting element 120 (i.e. the supporting element 120 can be integrated with the top light guide element 40 and the side light guide element 60). As a result, since the supporting element 120, the top light guide element 40 and the side light guide element 60 can be formed by the same process, the process for fabricating the micro semiconductor structure 100 can be simplified, thereby improving the processing efficiency and yield.

According to embodiments of the disclosure, the supporting element 120 can disposed on two side surfaces 24 (which are opposite each other) of the epitaxial structure 20 of the micro semiconductor chip 10, or can be disposed on the all side surfaces 24 of the epitaxial structure 20 of the micro semiconductor chip 10. In an embodiment (not shown), one end of the supporting element 120 can be disposed on the top surface 22 or the bottom surface of the epitaxial structure 20.

According to embodiments of the disclosure, the micro semiconductor chip can be subsequently transferred and assembled into a variety of illumination or display applications, such as a display device. The display device can include other components depending on its application. These other components include (but are not limited to) memory, touch panel controllers, and batteries. In other embodiments, the micro LED display can be a television, tablet computer, cell phone, laptop computer, computer monitor, stand-alone terminal server, digital camera, handheld game console, media display, electronics book display, car display or large area electronic board display.

Since the micro semiconductor chip of the disclosure has top light guide element, and the light extraction surface of the micro semiconductor chip is not a planar surface, the micro semiconductor chip is not suitable to be picked up by the conventional transfer device (i.e. the probability of failing to pick the micro semiconductor chip up would be increased). Accordingly, the disclosure also provides a transfer device, which is used to transfer the micro semiconductor chip of the disclosure or to dispose the micro semiconductor chip of the micro semiconductor structure.

Figure 15:
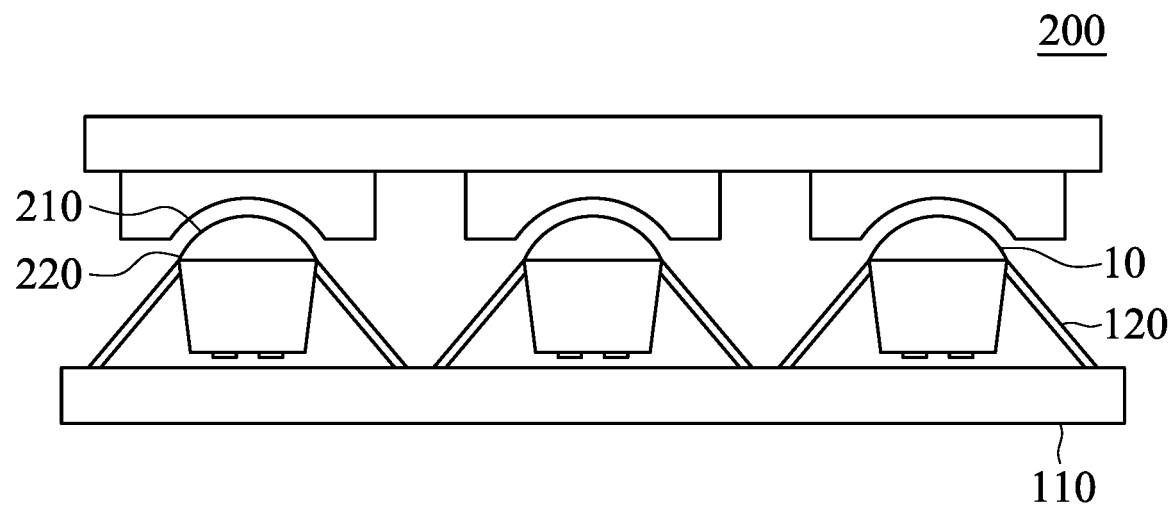
FIG. 15 is a cross-sectional diagram of the transfer device and the micro semiconductor structure according to an embodiment of the disclosure.

According to embodiments of the disclosure, as shown in FIG. 15, the transfer device 200 includes at least one pickup element 210 which is used to pick up the micro semiconductor chip 10. The pickup element 210 has a transferring surface 220, and the contour of the transferring surface 220 matches the contour of at least a part of the light extraction surface 42 of the micro semiconductor chip 10. According to embodiments of the disclosure, the transferring surface can be a curved surface, a combination of at least two curved surfaces, or a combination of at least one curved surface and at least one planar surface. The contour of at least a part of the light extraction surface 42 of the micro semiconductor chip 10 can be constituted by the top light guide element 40, or can be constituted by other protective elements disposed on the semiconductor chip 10. Namely, the light extraction surface 42 of the disclosure meets the following condition: the contour of the transferring surface 220 of the pickup element 210 matches the contour of at least a part of the light extraction surface 42 of the micro semiconductor chip 10.

Figure 16:
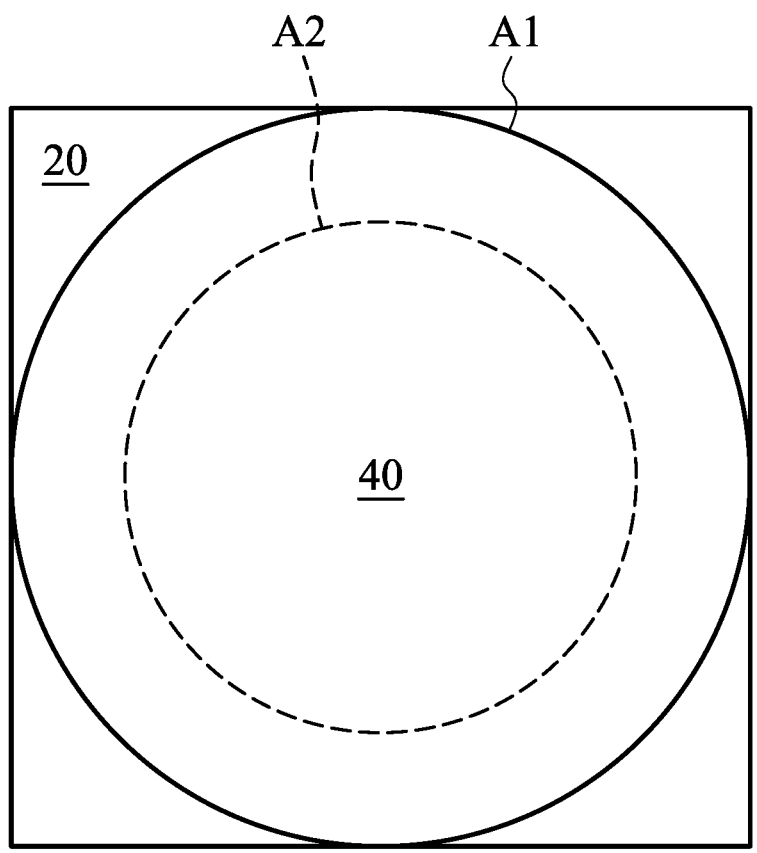
FIG. 16 is a schematic top-view diagram of the micro semiconductor chip according to an embodiment of the disclosure.

FIG. 16 is a schematic top-view diagram of the micro semiconductor chip 10 according to an embodiment of the disclosure. According to embodiments of the disclosure, as shown in FIG. 16, the light extraction surface 42 of the top light guide element 40 of the micro semiconductor chip 10 has an area A1, and the contour of the light extraction surface 42, which matches the contour of the transferring surface 220 of the pickup element 210, of the top light guide element 40 of the micro semiconductor chip 10 has an area A2. In particular, A2/A1 is between 0.5 and 1 (such as 0.5, 0.7, 0.9 or 1).

Figure 17:
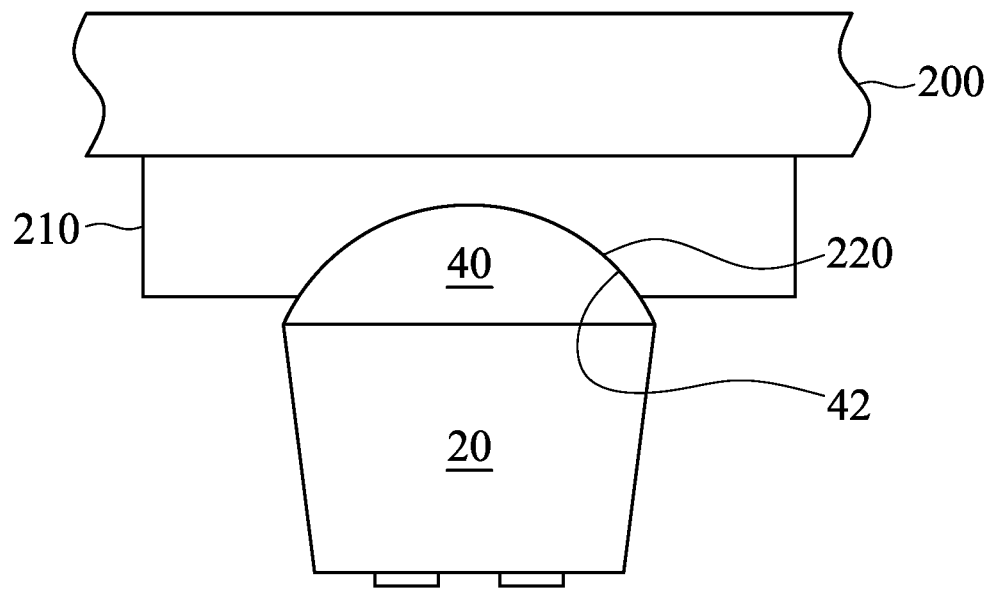
FIGS. 17 and 18 are schematic diagrams showing the step for picking up the micro semiconductor chip via the transfer device according to embodiments of the disclosure.
Figure 18:
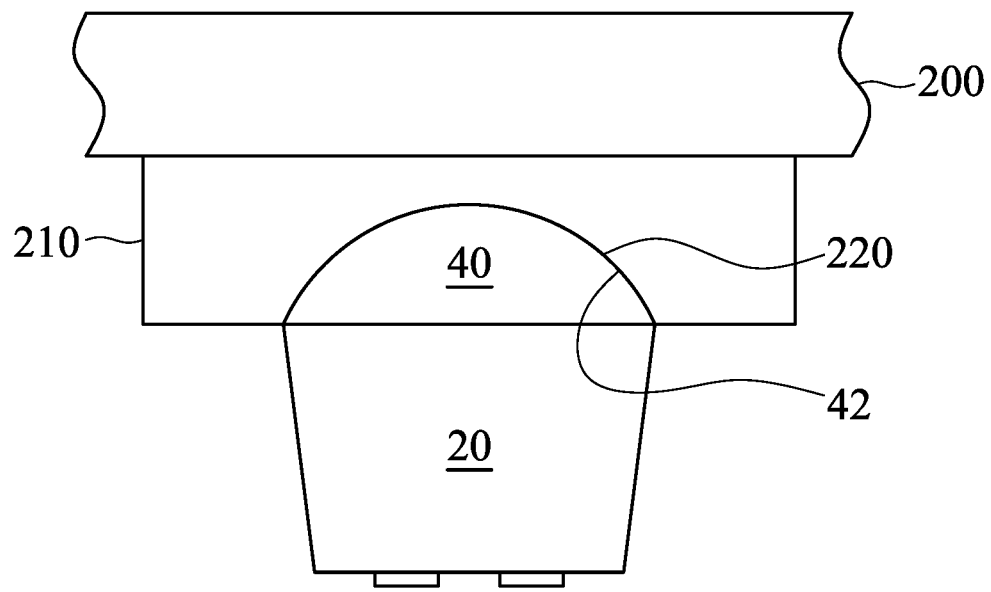

According to embodiments of the disclosure, as shown in FIG. 17, the contour of the transferring surface 220 of the pickup element 210 matches the contour of at least a part of the light extraction surface 42 of the top light guide element 40 of the micro semiconductor chip 10, and A2/A1 is between 0.5 and 0.99 (such as 0.5, 0.7, 0.9 or 0.95). According to embodiments of the disclosure, as shown in FIG. 18, the whole contour of the transferring surface 220 of the pickup element 210 matches the whole contour of the light extraction surface 42 of the micro semiconductor chip 10.

According to embodiments of the disclosure, the micro semiconductor chip 10 of the disclosure is subjected to a transfer process via the transfer device 200, and the transfer process can include a pickup step and a place step.

In the pickup step, the micro semiconductor chip 10 can be picked up by a transfer device 210. At first, the transferring surface 220 of the pickup element 210 is in contact with the light extraction surface 42 of the top light guide element 40. Next, the micro semiconductor chip 10 is picked up to be separated from the substrate 110 by the pickup element 210. For example, methods of mechanical electrostatic attraction, vacuum drawing or adhesion by adhesive tape are used to perform the transfer process. It should be noted that the micro semiconductor chip 10 is more likely to be picked up with a higher A2/A1. This reduces the difficulty of transferring the micro semiconductor chip 10 and improves the processing efficiency and display device fabrication yield. Conversely, if A2/A1 is too low, the probability of failing to pick the micro semiconductor chip up or the probability of misaligning the micro semiconductor chip would be increased. As a result, the processing efficiency and display device fabrication yield would be also reduced.

In the place step, the micro semiconductor chip 10 is disposed on a receiving substrate (such as a display substrate) via the transfer device 200. According to embodiments of the disclosure, a plurality of control circuits (not shown) can be formed on the display substrate in advance. After each micro semiconductor chip 10 is disposed in a predetermined location, the micro semiconductor chip 10 can contact the contact pad of the corresponding control circuit, and the micro semiconductor chip 10 is fixed to the display substrate.

Accordingly, the micro semiconductor chip having a top light guide element of the disclosure can enhance the light extraction efficiency of the micro semiconductor chip and improve the performance of the display device employing the micro semiconductor chip.

In addition, when the micro semiconductor chip of the disclosure is subjected to a transfer process via the transfer device of the disclosure, the probability of failing to pick the micro semiconductor chip up can be reduced, thereby improving the rate for transporting and transferring the micro semiconductor chip. As a result, the processing efficiency and display device fabrication yield would be improved.

Although the disclosure has been described by way of example and in terms of the preferred embodiments, it should be understood that various modifications and similar arrangements (as would be apparent to those skilled in the art) can be made herein without departing from the spirit and scope of the disclosure as defined by the appended claims.

What is claimed is:

1. A micro semiconductor chip, comprising:
   an epitaxial structure having a top surface, a bottom surface, and a side surface, wherein the top surface is opposite the bottom surface, and the side surface connects the top surface to the bottom surface;
   a first-type electrode and a second-type electrode disposed on the bottom surface of the epitaxial structure; and
   a top light guide element disposed on the top surface of the epitaxial structure, wherein the top light guide element has a light extraction surface and a bottom surface, wherein the edge of the light extraction surface overlaps the edge of the bottom surface of the top light guide element, and the light extraction surface of the micro semiconductor chip is a curved surface, a combination of at least two curved surfaces, or a combination of at least one curved surface and at least one planar surface, wherein the top light guide element consists of a thermal curable material, and wherein the refractive index of the thermal curable material is greater than 1, and the refractive index of the thermal curable material is equal to or less than the refractive index of the epitaxial structure.

2. The micro semiconductor chip as claimed in claim 1, wherein an orthogonal projection of the light extraction surface onto the top surface of the epitaxial structure has an area S2, and the top surface of the epitaxial structure has an area S1, wherein S2/S1 is between 0.7 and 1.

3. The micro semiconductor chip as claimed in claim 1, wherein the ratio (H1/H) of the maximum height H1 of the top light guide element in the light extraction direction to the maximum height H of the epitaxial structure in the light extraction direction is between 0.1 and 0.5.

4. The micro semiconductor chip as claimed in claim 1, further comprising:
   a side light guide element disposed on the side surface, wherein the refractive index of the side light guide element is greater than 1, and the refractive index of the side light guide element is less than or equal to the refractive index of the epitaxial structure.

5. The micro semiconductor chip as claimed in claim 4, wherein the top light guide element and the side light guide element are made of the same material.

6. A transfer device, which is used to transfer a micro semiconductor chip as claimed in claim 1, comprising:
   at least one pickup element, which is used to pick up the micro semiconductor chip, wherein the pickup element has a transferring surface, and a contour of the transferring surface matches a contour of at least a part of the light extraction surface of the micro semiconductor chip, wherein the light extraction surface of the micro semiconductor chip is a curved surface, a combination of at least two curved surfaces, or a combination of at least one curved surface and at least one planar surface.

7. The transfer device as claimed in claim 6, wherein the light extraction surface of the micro semiconductor chip has an area A1, and the contour of the light extraction surface, which matches the contour of the transferring surface, of the micro semiconductor chip has an area A2, and wherein A2/A1 is between 0.5 and 1.

8. The micro semiconductor chip as claimed in claim 1, wherein the thermal curing temperature of the thermal curable material is between 50° C. and 250° C.

9. The micro semiconductor chip as claimed in claim 8, wherein the light transmittance of the thermal curable material is greater than or equal to 80%.

10. The micro semiconductor chip as claimed in claim 8, wherein the thermal curable material is photoresist material.

11. A micro semiconductor structure, comprising:
a substrate;
at least one micro semiconductor chip disposed on the substrate; and
at least one supporting element, wherein one end of the supporting element is disposed on the substrate, and another end of the supporting element is connected to the side surface of the micro semiconductor chip so that the micro semiconductor chip is fixed to the substrate via the supporting element, wherein the micro semiconductor chip comprises:
an epitaxial structure, which has a top surface, a bottom surface, and a side surface, wherein the top surface is opposite the bottom surface, and the side surface connects the top surface to the bottom surface;
a first-type electrode and a second-type electrode disposed on the bottom surface of the epitaxial structure; and
a top light guide element disposed on the top surface of the epitaxial structure, wherein the top light guide element has a light extraction surface and a bottom surface, wherein the edge of the light extraction surface completely overlap the edge of the bottom surface of the top light guide element, and the light extraction surface is a curved surface, a combination of at least two curved surfaces, or a combination of at least one curved surface and at least one planar surface, wherein the top light guide element consists of a thermal curable material, and wherein the refractive index of the thermal curable material is greater than 1, and the refractive index of the thermal curable material is equal to or less than the refractive index of the epitaxial structure.

12. The micro semiconductor structure as claimed in claim 11, wherein the top light guide element and the supporting element are made of the same material.

13. The micro semiconductor structure as claimed in claim 12, wherein the top light guide element is integrated with the supporting element.

* * * * *